United States Patent
Childs (10) Patent No.: US 10,461,639 B1
(45) Date of Patent: Oct. 29, 2019

(54) CURRENT MODE HYSTERETIC CONTROL WITH CLOCKED RAMP

(71) Applicant: Dialog Semiconductor (UK) Limited, London (GB)

(72) Inventor: Mark Childs, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/110,091

(22) Filed: Aug. 23, 2018

(51) Int. Cl.
*H02M 3/158* (2006.01)
*H02M 3/156* (2006.01)
*H03L 7/10* (2006.01)
*H03K 4/48* (2006.01)
*H02M 1/00* (2006.01)

(52) U.S. Cl.
CPC .............. *H02M 3/156* (2013.01); *H03K 4/48* (2013.01); *H03L 7/10* (2013.01); *H02M 2001/0041* (2013.01)

(58) Field of Classification Search
CPC ......... H02M 3/156; H02M 2001/0041; H02M 2001/0003; H02M 2001/0025; H02M 2001/0029; H02M 3/158; H02M 3/1588
See application file for complete search history.

(56) References Cited

U.S. PATENT DOCUMENTS

| | | | |
|---|---|---|---|
| 4,929,882 A | 5/1990 | Szepesi | |
| 6,147,478 A | 11/2000 | Skelton et al. | |
| 2008/0067993 A1 | 3/2008 | Coleman | |
| 2009/0310633 A1* | 12/2009 | Ikegami | H04N 9/3123 372/26 |

* cited by examiner

*Primary Examiner* — Gary L Laxton
(74) *Attorney, Agent, or Firm* — Saile Ackerman LLC; Stephen B. Ackerman (57) ABSTRACT

Current in a switching converter is controlled using a current-mode hysteretic controller. The high-side switch (usually a PMOS) is turned off when the current in the coil exceeds a certain peak control current. The low-side switch (usually an NMOS) is turned off when the current in the coil falls below a certain valley control current. A current ramp is added to one of these control currents, either peak or valley. The current ramp is initiated by a reference clock signal, which has the effect of synchronizing the switching converter to the reference clock.

29 Claims, 7 Drawing Sheets

CURRENT MODE HYSTERETIC CONTROL WITH CLOCKED RAMP

BACKGROUND

Field

The disclosure relates generally to switching converters, with current-mode hysteretic operation.

Description

Existing Buck switching converters use both synchronous peak current mode control and synchronous valley current mode control. In synchronous peak current mode control, the high side device (usually a PMOS) is turned on with the clock signal, and turned off with the peak current limit. The low side device (usually an NMOS) is turned on when the high side device is turned off, and remains on until the next clock edge, where the cycle is repeated. In synchronous valley current mode control, the NMOS is turned on with the clock signal, and turned off with the valley current signal. The PMOS is turned on when the NMOS is turned off, and remains on until the next clock edge, where the cycle is repeated.

These are known control schemes for Buck converter and other types of switching converters. In both these schemes, a compensation ramp must be added to the current signal to prevent sub harmonic oscillations. In the case of the peak mode control, the compensation ramp must be added to the sense coil current signal or subtracted from the peak current limit. In the valley mode control scheme, the compensation ramp must be subtracted from the sensed current signal or added to the valley current control level.

In related art known to the inventor, a current-mode hysteretic control scheme is used in a Buck switch converter, referred to as peak-valley mode control, and is asynchronous and not clocked. In this scheme the high side device (usually a PMOS) is turned on when the low side device (usually an NMOS) is turned off by the valley limit. The PMOS remains on until the coil current reaches the peak current limit level, and then is turned off. The NMOS is turned on when the PMOS is turned off, and the coil current falls. When the coil current falls below the valley current control level, the NMOS is turned off and the PMOS is turned on. The cycle is then repeated.

This scheme is asynchronous, and there is no clock input. The frequency is set only by the time taken for the coil current to ramp between the two current limit levels, peak and valley. No compensation ramp is required, as the system fundamentally does not suffer sub harmonic oscillation.

While asynchronous current-mode hysteretic operation is convenient for a wide range of applications, it is sometimes necessary to control the frequency and/or phase of the Buck switching converter. Some examples of this include controlling EMI or noise issues in the application, where it can be beneficial to lock the frequency of the Buck converter to a known frequency, or controlling supply noise spikes to ensure minimal cross-talk between adjacent Buck converters, where it is necessary to phase the Buck converters 180° apart. In addition, in a multi-phase Buck converter, it may be highly beneficial to offset the phases to interleave their switching, or in a Buck converter with coupled coils, the offset of the coupled phases may be critical to correct operation.

It is possible to control the frequency and phase of an asynchronous converter by wrapping a phase lock loop (PLL) or frequency lock loop (FLL) around the switching converter. In this case, the PLL/FLL compares the switching of the Buck converter with an input reference clock. By adjusting the offset between peak and valley current limits, it is possible to increase or decrease the switching frequency of the switching converter.

In this scheme the Buck converter itself forms the voltage-controlled oscillator (VCO) of the FLL/PLL. These schemes are known and have been proven to work. However, the main drawbacks of a PLL/FLL based switching converter is the complexity of the PLL/FLL loop, and the time taken for the loop to adjust the Buck converter and correctly lock onto the reference clock. During this time, the switching converter phase will be uncontrolled. This is of particular concern in a multiphase Buck converter or a Buck converter using coupled coils.

SUMMARY

An object of the disclosure is to provide synchronous operation in a current-mode hysteretic DC-DC switching converter.

A further object of the disclosure is to provide the synchronous operation without the complexity of a phase lock loop (PLL) or frequency lock loop (FLL) loop, and without introducing sub harmonic behavior.

Still further, another object of the disclosure is to preserve the accurate peak-current limit that is inherent in a current-mode hysteretic DC-DC switching converter.

To accomplish the above and other objects, a current-mode hysteretic control circuit with a clocked ramp, for a DC-DC switching converter, is disclosed. A high-side switch is configured to turn off when the current in the coil exceeds a certain peak control current. A low-side switch is configured to turn off when the current in the coil falls below a certain valley control current. A current ramp is configured to add to one of the control currents, and to initiate by a reference clock signal. The switching converter is configured to operate with the peak control current and valley control current, and is configured with an offset to provide hysteretic current-mode operation.

The above and other objects are further achieved by a method for a current-mode hysteretic control circuit, with a clocked ramp, for a DC-DC switching converter. A high-side switch is turned off when the current in the coil exceeds a certain peak control current. A low-side switch is turned off when the current in the coil falls below a certain valley control current. A current ramp is added to one of the control currents. The current ramp is initiated by a reference clock signal, synchronizing the switching converter to the reference clock, providing hysteretic current-mode operation.

In various embodiments the function may be achieved using a PMOS high-side switch, and an NMOS low-side switch.

In various embodiments the function may be achieved using a current ramp added to the valley current limit, with a slope of similar order of magnitude to the down slope of the current in the coil.

In various embodiments the function may be achieved using a current ramp added to the peak current limit, with a slope of similar order of magnitude to the up slope of the current in the coil.

In various embodiments the function may be achieved using a current ramp added to the valley current limit, initiated with the reference clock signal, reset with the valley current limit.

In various embodiments the function may be achieved using a current ramp subtracted from the peak current limit, initiated with the reference clock signal, reset with the peak current limit.

In various embodiments the function may be achieved using a current ramp with a slope between the up slope and the down slope of the current in the coil.

In various embodiments the function may be achieved using a current ramp added to the valley current limit and the peak current limit, with a slope of similar order of magnitude as the down slope of the current in the coil.

In various embodiments the function may be achieved using an offset between the peak current limit and the valley current limit proportional to a calculated predicted peak-to-peak current ripple in the coil.

In various embodiments the function may be achieved using an offset equal to, or less than, (S1*S2)/(S2−S1), where S1 is a positive slope of the current in the coil when the high-side switch is on, and S2 is a negative slope of the current in the coil when the low-side switch is on.

In various embodiments the function may be achieved using an offset 1.5× a calculated peak-to-peak current ripple in the coil.

DETAILED DESCRIPTION

The present disclosure involves a DC-DC switching converter controlled by a current-mode hysteretic controller. The high-side switch (usually a PMOS) is turned off when the current in the coil exceeds a certain peak control current. The low-side switch (usually an NMOS) is turned off when the current in the coil falls below a certain valley control current. A current ramp is added to one of these control currents, peak or valley. The current ramp is initiated by a reference clock signal. This has the effect of synchronizing the switching converter to the reference clock.

Figure 1:
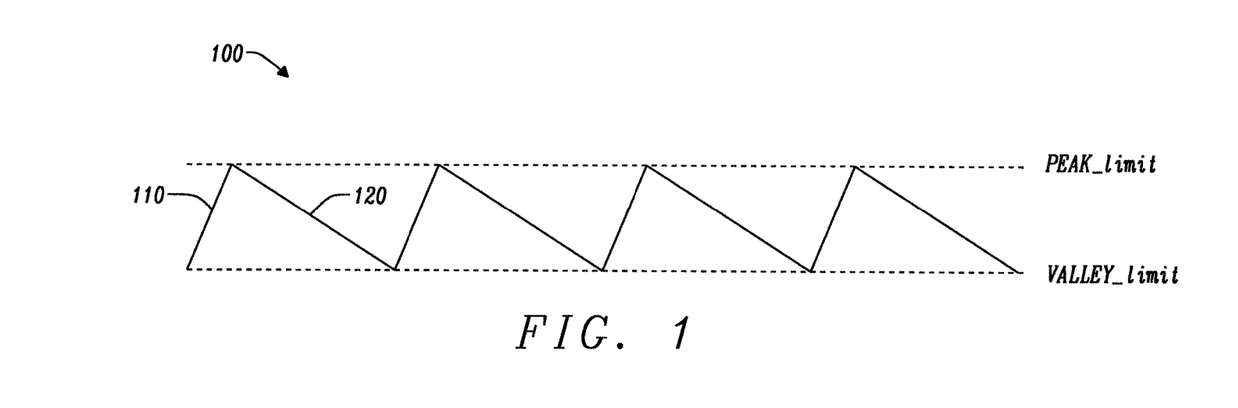
FIG. 1 illustrates current-mode hysteretic control, in a Buck switching converter.

FIG. 1 illustrates current-mode hysteretic control 100, in a Buck switching converter. In this mode of operation, the Buck converter turns the high-side switch off with a peak-current signal PEAK_limit, and turns the low-side switch off with a valley current signal VALLEY_limit. The coil current ramps up in 110, when the high-side switch is on, until it hits PEAK_limit. At this point the high-side switch is turned off and low-side switch turns on. The coil current then ramps down in 120, until it hits VALLEY_limit. At this point the low-side switch is turned off, and the high-side switch is turned on again. The peak-to-peak current ripple (Ip2p) is therefore directly controlled by the offset between the peak and valley current limits.

Figure 2:
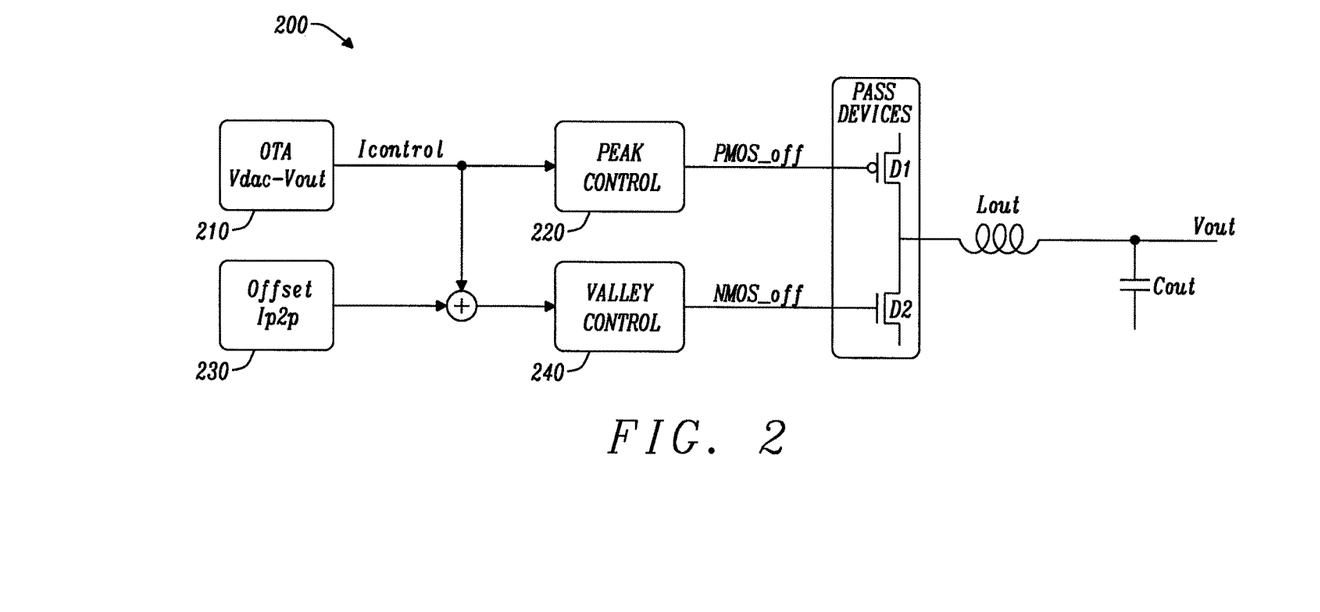
FIG. 2 shows a simplified system to achieve peak-to-peak current ripple, controlled by the offset between the peak and the valley current limits.

FIG. 2 shows block diagram 200, a simplified system to achieve peak-to-peak current ripple controlled by the offset between the peak and the valley current limits. An operational transconductance amplifier OTA 210 generates a control current Icontrol, which is proportional to the difference between the target output voltage Vdac and the actual output voltage Vout, measured across inductor Lout connected between a high-side and a low-side pass device. This current is then directly used to control the peak current limit, in PEAK CONTROL 220. An offset current is generated in Offset 230 and subtracted from the control current, to create a valley current limit, in VALLEY CONTROL 240. This offset will directly control the peak-to-peak current ripple in inductor Lout. The peak current control comparator will turn off the high-side pass device D1 with PMOS_OFF, when the peak current limit is reached. The valley control comparator will turn off the low-side pass device D2 with NMOS_OFF, when the valley current limit is reached. The offset can be added to either (or both) the baseline peak or valley current limit. The examples here keep the peak current limit equal to the OTA current, as there is some benefit in having a well-defined peak current limit in normal operation.

The issue with this scheme of operation is that the switching converter is fundamentally asynchronous, because there is no clock input to the system. Only the slopes of the inductor current, and the offset between the peak and valley current limits, control the switching frequency. This can be an issue in real application systems. It is of particular concern in multiphase switching converters, where the phases should be correctly sequenced for best performance. This is critical in switching converters that make use of coupled coils.

Figure 3:
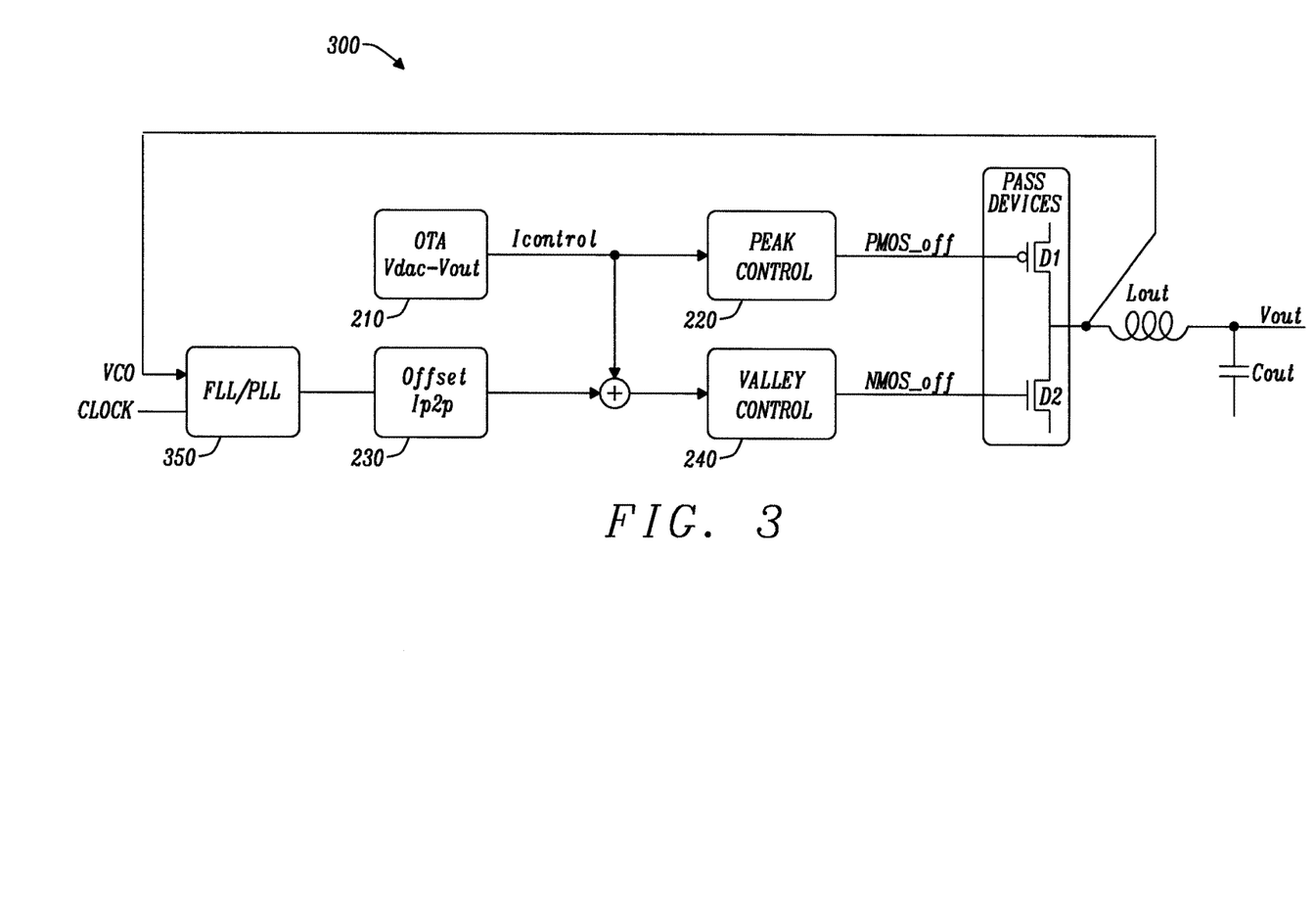
FIG. 3 illustrates how a switching converter can lock to an external reference clock, using a frequency lock loop or phase lock loop built around it.

FIG. 3 illustrates how a switching converter can lock to an external reference clock using a frequency lock loop (FLL) or phase lock loop (PLL) built around it. The FLL/PLL 350 loop adjusts the Offset 330 to control the frequency and phase of the Buck switching converter. The Buck converter becomes the voltage-controlled oscillator VCO in the FLL/PLL loop. This scheme has been used extensively in commercial switching converters. However the scheme is complex and sensitive to noise. It also takes significant time to settle after a disturbance, which can be of concern with EMI and output ripple issues.

An alternative method to synchronize the Buck switching converter is to add a clocked ramp to either the peak or the valley current limit.

Figure 4:
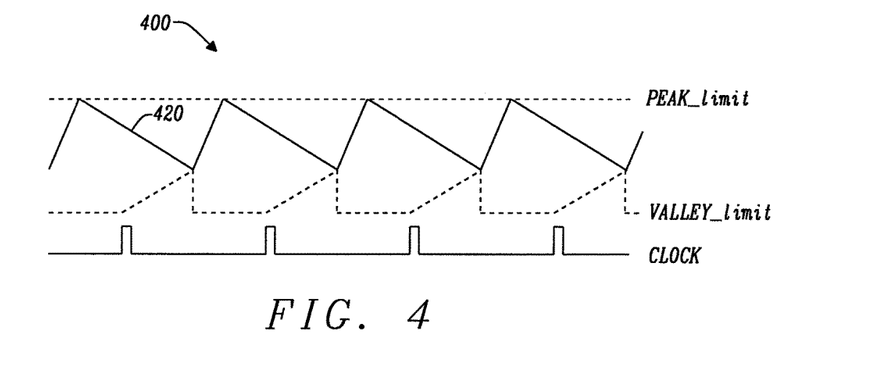
FIG. 4 shows a clocked ramp added to the valley current limit, causing a switching converter to switch the low side device off each clock cycle.

FIG. 4 shows a clocked ramp added to the valley current limit causing the switching converter to switch the low side device off each clock cycle, in 400. The ramp is initiated at the CLOCK edge. The valley current limit VALLEY_limit rises over a clock period, as the clocked ramp is added. At some point the coil current, 420, will hit the valley current limit, and the low-side device will turn off. By adding the ramp to the valley current limit, the likelihood the coil current will hit the valley current limit within a clock cycle increases.

Figure 5:
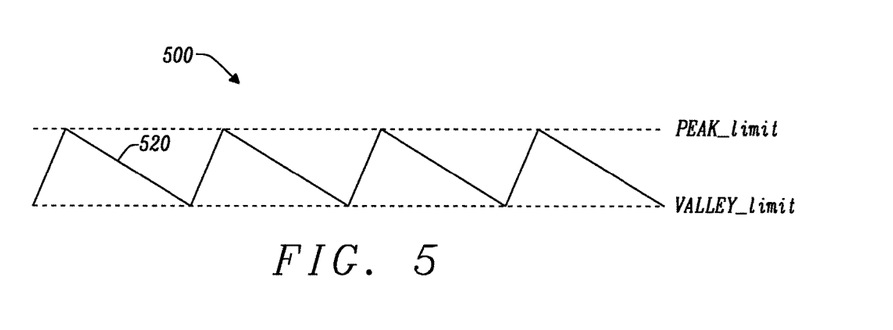
FIG. 5 illustrates when a ramp has a slope of zero, and is added to the valley current limit.

FIG. 5 illustrates when a ramp has a slope of zero, and is added to the valley current limit VALLEY_limit, in 500. Here, the Buck switching converter is fully asynchronous, and neither the frequency of the coil current 520, nor the phase, is controlled.

Figure 6:
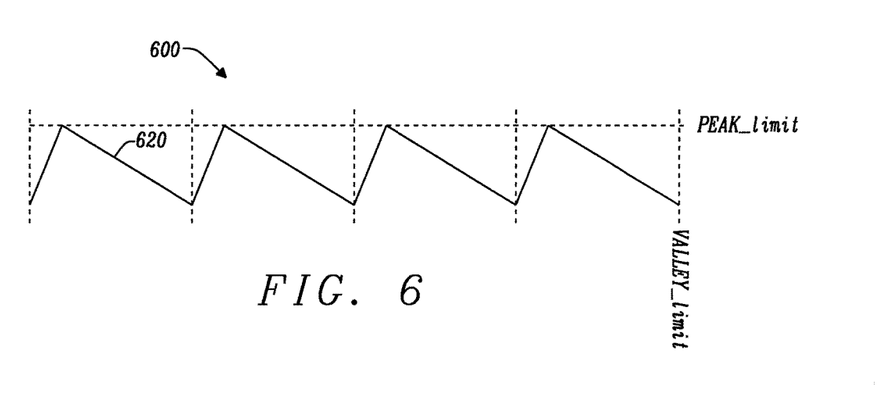
FIG. 6 shows when a ramp has an infinite slope, and is added to the valley current limit.

FIG. 6 shows when a ramp has an infinite slope, and is added to the valley current limit VALLEY_limit, in 600. Here, the switching converter is operating in synchronous peak mode, and the frequency of coil current 620, and the phase, are directly controlled by the clock, causing the Buck converter to suffer sub harmonic oscillation.

If the ramp is of the same order of magnitude as the falling slope of the coil current, then the ramp will add a synchronizing effect of similar magnitude to the standard valley current limit. The ramp will act to lock the switching converter to the input reference clock. The ripple will then no longer be defined by the valley current limit, and will instead be defined by the slopes of the inductor current, and the frequency of the input reference clock.

In various embodiments the function may be achieved using a current ramp added to the valley current limit, wherein the ramp has a similar order of magnitude as a slope equal to, or less than, (S1*S2)/(S2−S1), where S1 is a positive slope of the current in the coil when the high-side switch is on, and S2 is a negative slope of the current in the coil when the low-side switch is on. This boundary case also ensures no subharmonic will occur.

Figure 7:
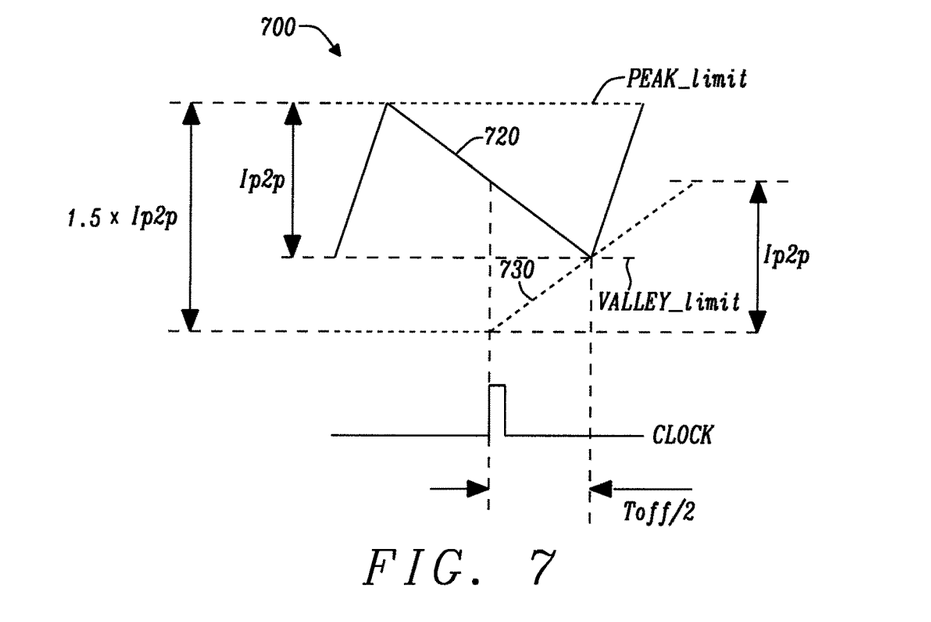
FIG. 7 illustrates, where in order to correctly lock the switching converter to the input clock, the offsets used are controlled.

FIG. 7 illustrates 700, where in order to correctly lock the switching converter to the input clock, the offsets used are well controlled. In the preferred embodiment, the ramp is added to the valley current limit VALLEY limit, and the ramp slope 730 is equal to the down slope of the inductor current 720. The peak-to-peak current ripple Ip2p of the inductor current can be estimated from the operating conditions of the Buck converter. The baseline valley current limit is then offset by 1.5×Ip2p, to ensure the valley current limit VALLEY_limit occurs roughly halfway Toff/2 through the clock period.

Figure 8:
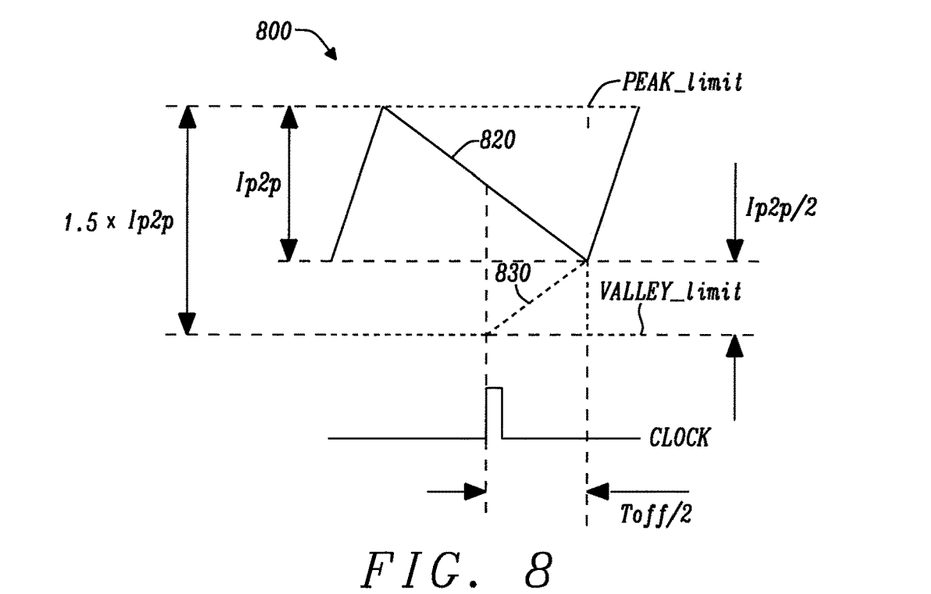
FIG. 8 shows the clocked ramp reset straight after the valley current limit has occurred, halfway through the clock period.

FIG. 8 shows 800, where the clocked ramp must be reset straight after the valley current limit has occurred, halfway Toff/2 through the clock period. This scheme will ensure that the frequency of the Buck switching converter is controlled by the input clock. The switching converter will then tend to lock within a few cycles and stay locked over a wide range of conditions. The ramp is added to the VALLEY_limit, and its slope 830 is approximately equal to the down slope of the current in the coil, 820. The peak-to-peak current ripple Ip2p can be estimated from the operating conditions, and the baseline valley current limit is offset by 1.5×Ip2p. For the case when the ramp is added to the PEAK_limit, the ramp slope is approximately equal to the up slope of the current in the coil. There may also be the case where the slope of the ramp is a value between the up and the down slope of the current in the coil.

Figure 9:
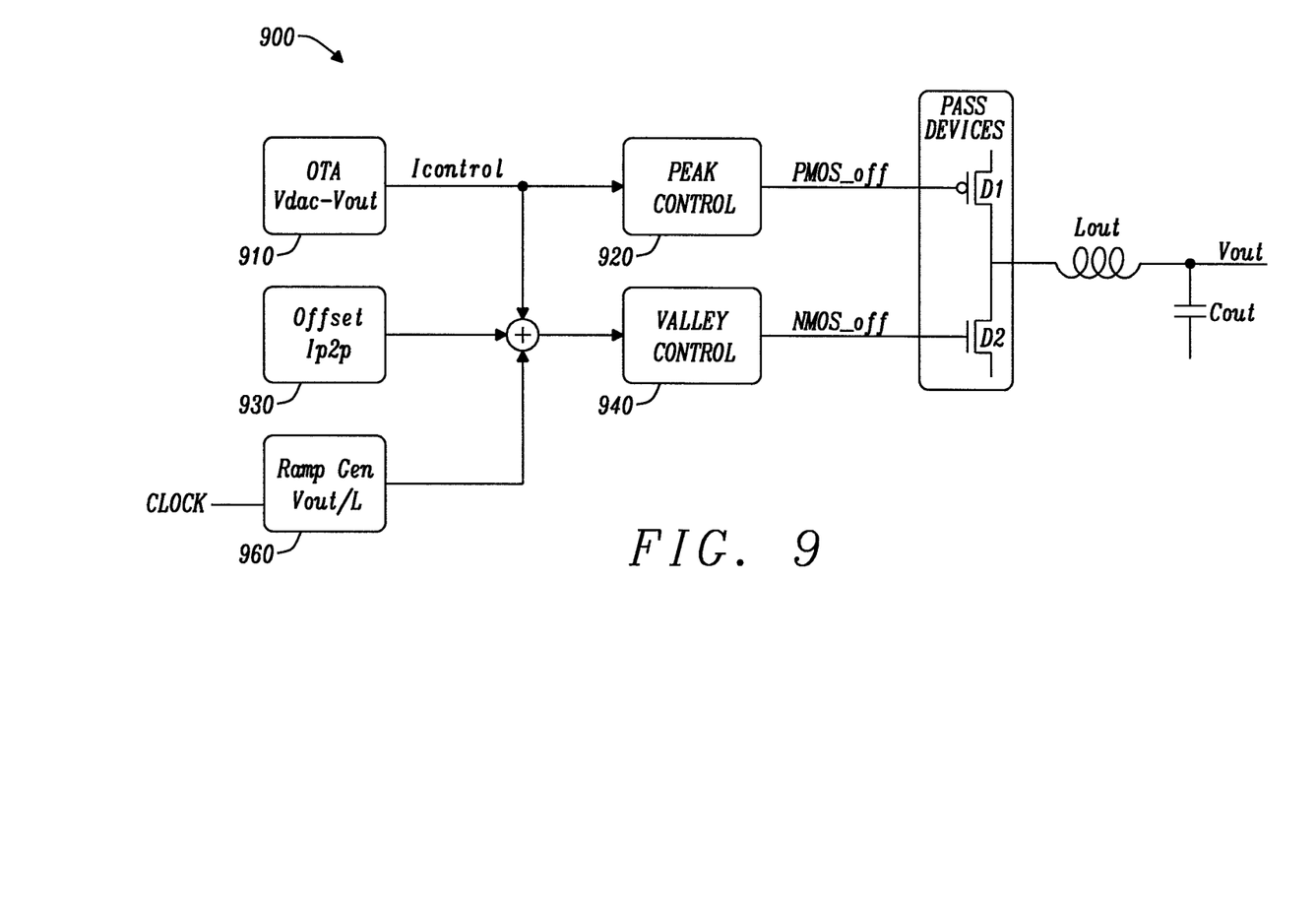
FIG. 9 shows a simplified block diagram, for a system suitable to implement the principles of the disclosure.

FIG. 9 shows simplified block diagram 900, of a system suitable to implement the principles of the disclosure. The system is similar to the original current-mode hysteretic system in FIG. 2, where OTA 910 controls the peak current directly. The low-side pass device D2 (usually an NMOS) is turned off with the comparator of VALLEY CONTROL 940, when the valley current limit is reached. Offset block 930 creates a baseline valley control current, and modifies the Icontrol current, where the offset between the peak current limit and the valley current limit is controlled to be proportional to a calculated predicted peak-to-peak current ripple in inductor Lout. Here the offset is 1.5× the calculated expected peak-to-peak ripple (Ip2p) at the frequency of the input clock. The comparator of PEAK CONTROL 920 will turn off the high-side pass device D1 (usually a PMOS), when the peak current limit is reached.

In FIG. 9, another block has been added, Ramp Gen 960, that adds a clocked ramp to the baseline valley control current. The clocked ramp slope is set to be approximately equal to the down slope of the inductor current (Vout/L), where the output voltage is measured across the inductor Lout, connected between the high-side and the low-side pass device. The clocked ramp is started with the clock edge, and reset with a valley comparator signal. Note, the offset can be added to either (or both) the baseline peak or valley control current. The examples here keep the peak current limit equal to the OTA current, as there is some benefit in having a well-defined peak current limit in normal operation. For the case where the ramp is subtracted from the peak limit, the ramp is initiated with the clock signal, and reset with peak control signal.

Figure 10:
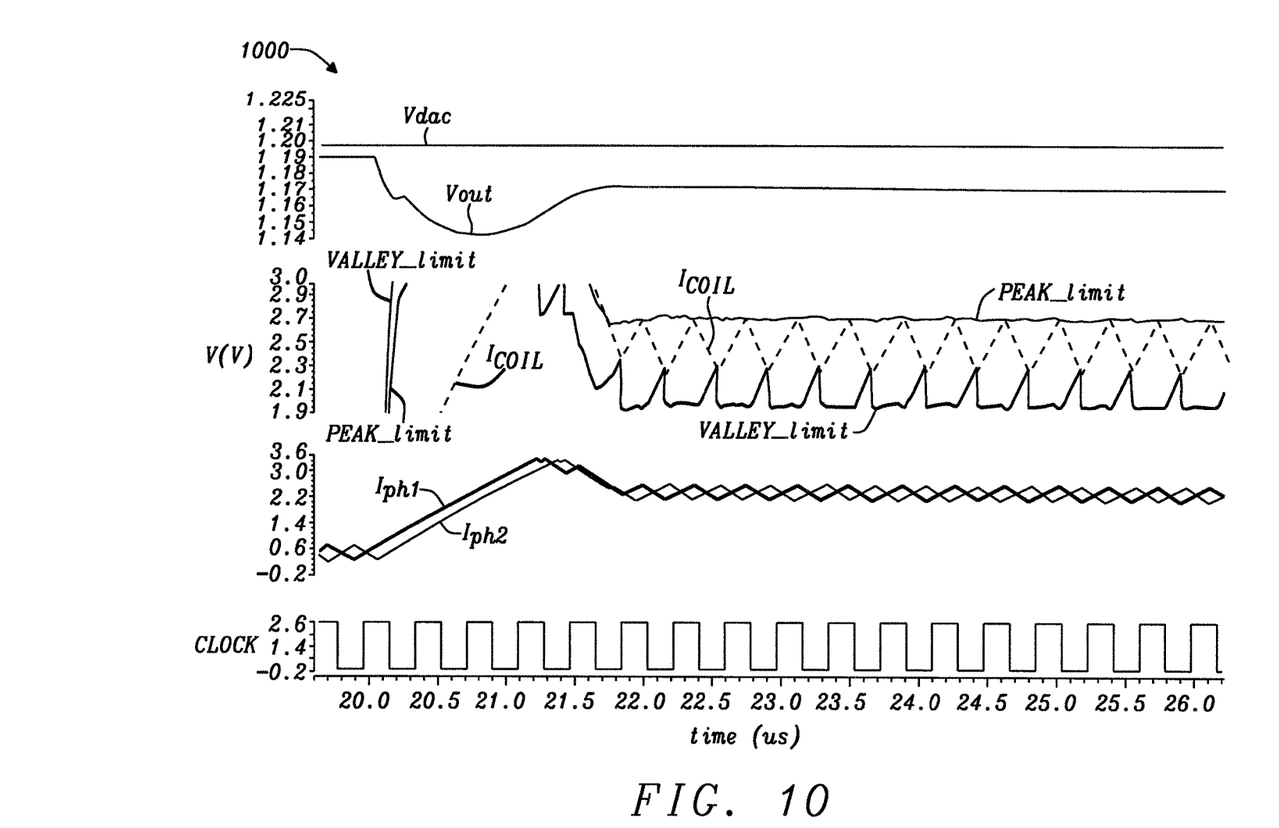
FIG. 10 shows a simulation from a model of a DC-DC switching converter architecture for a dual-phase Buck converter, including the response of the Buck converter to a load step.

FIG. 10 shows a simulation from a model of a DC-DC switching converter architecture for a dual-phase Buck converter, including the response of the Buck converter to a load step. The top panel shows the target voltage Vdac and the output voltage Vout. The second panel shows the coil current Icoil, the peak current limit PEAK_limit and the valley current limit VALLEY_limit. The valley current limit is equal to the peak current limit, minus a fixed offset, and the ramp current added. The third panel shows the coil currents for the two phases Iph1 and Iph2. The forth panel shows the clock for one of the phases. It can clearly be seen that the switching converter is running synchronous to the clock. It can also be seen that no sub harmonic oscillation is present. The Buck converter locks to the clock frequency immediately, as the coil current settles after the overshoot.

Figure 11:
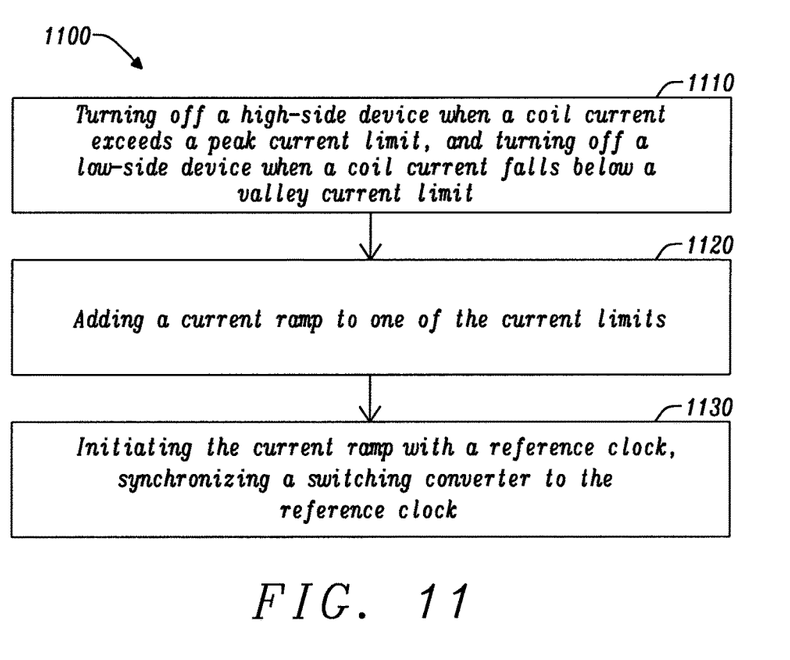
FIG. 11 illustrates a method for a current-mode hysteretic control circuit, with a clocked ramp, in a DC-DC switching converter.

FIG. 11 is flow chart 1100, of a method for a current-mode hysteretic control circuit, with a clocked ramp, in a DC-DC switching converter. The steps include 1110, a high-side device turning off when a current in a coil exceeds a peak current limit, and a low-side device turning off when the current in the coil falls below a valley current limit. The steps also include 1120, a current ramp being added to one of the current limits. The steps also include 1130, the current ramp being initiated by a reference clock signal, synchronizing a switching converter to the reference clock, providing hysteretic current-mode operation.

The advantages of one or more embodiments of the present disclosure include providing current-mode hysteretic operation, with low frequency stability, inherently no sub harmonic oscillation, and defined peak and valley currents. The disclosure also allows the frequency of the switching converter to be fixed, and the relative phase, relative to another phase using the same control scheme, to be well controlled. The disclosure allows phase locking within three clock cycles after a disturbance.

While this invention has been particularly shown and described with reference to the preferred embodiments thereof, it will be understood by those skilled in the art that various changes in form and details may be made without departing from the spirit and scope of the invention.

The invention claimed is:

1. A current mode hysteretic control circuit, in a DC-DC switching converter, comprising:
   a high-side switch, configured to turn off when a current in a coil exceeds a peak current limit.
   a low-side switch, configured to turn off when the current in the coil falls below a valley current limit;
   a ramp generator, configured to generate a current ramp, initiated with a reference clock signal, and reset when said valley current limit or said peak current limit is reached by said coil current, wherein said current ramp is used to lock a frequency of said switching converter; and said switching converter configured with an offset between said peak current limit and said valley current limit, to provide hysteretic current-mode operation.

2. The circuit of claim 1, wherein said DC-DC switching converter is configured to switch with a frequency similar to said reference clock signal.

3. The circuit of claim 1, further comprising an operational transconductance amplifier configured to generate a control current, proportional to a difference between a target output voltage and an actual output voltage, and to supply said peak current limit and said valley current limit.

4. The circuit of claim 1, further comprising said coil, having one end connected between said high-side switch and said low-side switch, and another end at an output of said DC-DC switching converter.

5. The circuit of claim 1, wherein said offset is configured to be added to either or both said peak current limit and said valley current limit.

6. The circuit of claim 1, wherein said DC-DC switching converter is multi-phase.

7. The circuit of claim 1, wherein said current ramp is added to said valley current limit.

8. The circuit of claim 1, wherein said current ramp is subtracted from said peak current limit.

9. The circuit of claim 7, wherein said current ramp is configured with a slope having a similar order of magnitude to a down slope of a current in said coil, and wherein said down slope is calculated by dividing said output of said DC-DC switching converter by said coil value.

10. The circuit of claim 1, wherein said current ramp is added to said peak current limit, and is configured with a slope having a similar order of magnitude to an up slope of a current in said coil.

11. The circuit of claim 1, wherein a slope of said current ramp is configured to have a value between that of an up slope and a down slope of said coil current.

12. The circuit of claim 1, wherein said current ramp is added to said valley current limit and said peak current limit, wherein said ramp has a similar order of magnitude as a down slope of said coil current.

13. The circuit of claim 1, wherein said current ramp is added to said valley current limit, wherein said ramp has a similar order of magnitude as a slope equal to, or less than, (S1*S2)/(S2−S1), where S1 is a positive slope of the current in the coil when the high-side switch is on, and S2 is a negative slope of the current in the coil when the low-side switch is on.

14. The circuit of claim 1, wherein said offset between said peak current limit and said valley current limit is controlled to be proportional to a calculated predicted peak-to-peak current ripple in said coil.

15. The circuit of claim 14, wherein said offset is controlled to be about 1.5 times that of said calculated predicted peak-to-peak current ripple in said coil.

16. The circuit of claim 1, where said high-side switch is a PMOS device and said low-side switch is an NMOS device.

17. A method for current mode hysteretic control, in a DC-DC switching converter, comprising:
    turning off a high-side device, when a current in a coil exceeds a peak current limit;
    turning off a low-side device, when the current in the coil falls below a valley current limit;
    adding a current ramp to one of the current limits; and
    initiating the current ramp with a reference clock signal, and resetting the current ramp when the coil current reaches the valley current limit, or the peak current limit, synchronizing a switching converter to the reference clock, providing hysteretic current-mode operation.

18. The method of claim 17, wherein said DC-DC switching converter switches with a frequency similar to that of said reference clock signal.

19. The method of claim 17, further comprising generating a control current with an operational transconductance amplifier, proportional to a difference between a target output voltage and an actual output voltage across said coil, which supplies said peak current limit and said valley current limit.

20. The method of claim 17, further comprising adding an offset to either or both said peak current limit and said valley current limit.

21. The method of claim 17, wherein said current ramp is added to said valley current limit.

22. The method of claim 17, wherein said current ramp is subtracted from said peak current limit.

23. The method of claim 21, wherein said current ramp has a slope having a similar order of magnitude to that of a down slope of a current in said coil.

24. The method of claim 19, wherein said current ramp is added to said peak current limit, and has a slope having a similar order of magnitude to an up slope of a current in said coil.

25. The method of claim 17, wherein a slope of said current ramp has a value between that of an up slope and a down slope of a current in said coil.

26. The method of claim 17, wherein said current ramp is added to said valley current limit and said peak current limit, wherein said ramp has a similar order of magnitude as a down slope of said coil current.

27. The method of claim 17, wherein said current ramp is added to said valley current limit, wherein said ramp has a similar order of magnitude as a slope equal to, or less than, (S1*S2)/(S2−S1), where S1 is a positive slope of the current in the coil when the high-side device is on, and S2 is a negative slope of the current in the coil when the low-side device is on.

28. The method of claim 17, wherein an offset between said peak current limit and said valley current limit is proportional to a calculated predicted peak-to-peak current ripple in said coil.

29. The method of claim 28, wherein said offset is about 1.5 times that of said calculated predicted peak-to-peak current ripple in said coil.

* * * * *